US008441083B2

(12) United States Patent
Tsukamoto et al.

(10) Patent No.: US 8,441,083 B2
(45) Date of Patent: May 14, 2013

(54) SEMICONDUCTOR DEVICE INCLUDING A MAGNETIC TUNNEL JUNCTION AND METHOD OF MANUFACTURING THE SAME

(75) Inventors: Keisuke Tsukamoto, Tokyo (JP); Mikio Tsujiuchi, Tokyo (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/460,377

(22) Filed: Apr. 30, 2012

(65) Prior Publication Data
US 2012/0211847 A1 Aug. 23, 2012

Related U.S. Application Data

(63) Continuation of application No. 12/474,974, filed on May 29, 2009.

(30) Foreign Application Priority Data

Aug. 7, 2008 (JP) .................................. 2008-204442

(51) Int. Cl.
*H01L 29/82* (2006.01)
*G11C 11/02* (2006.01)

(52) U.S. Cl.
USPC ............. 257/421; 257/427; 257/20; 257/414; 257/E29.323; 438/3; 360/324.2; 360/326

(58) Field of Classification Search .................... 257/20, 257/414, 421–427, E29.323; 438/3; 360/324–326, 360/313
See application file for complete search history.

(56) References Cited

U.S. PATENT DOCUMENTS

| 6,358,756 | B1 * | 3/2002 | Sandhu et al. ................... 438/3 |
| 6,998,665 | B2 | 2/2006 | Motoyoshi |
| 7,611,912 | B2 | 11/2009 | Hong et al. |
| 2006/0220083 | A1 * | 10/2006 | Abe ................................ 257/295 |
| 2007/0108543 | A1 | 5/2007 | Furuta et al. |

FOREIGN PATENT DOCUMENTS

| JP | 2003-243630 A | 8/2003 |
| JP | 2004-319725 A | 11/2004 |
| JP | 2006-019743 A | 1/2006 |
| JP | 2007-158301 | 6/2007 |
| WO | WO-2006-070803 A1 | 7/2006 |

OTHER PUBLICATIONS

Japanese Office Action with English Translation issued in Japanese Application No. 2008-204442 issued on Apr. 3, 2012.
Japanese Notice of Reasons for Refusal, and English translation thereof, issued in Japanese Patent Application No. 2008-204442, dated Nov. 6, 2012.

* cited by examiner

*Primary Examiner* — Jami M Valentine
(74) *Attorney, Agent, or Firm* — McDermott Will & Emery LLP

(57) ABSTRACT

To provide a semiconductor device that has an improved adhesion between a bottom conductive layer and a protection film protecting an MTJ element.
This semiconductor device includes a bottom electrode formed over a semiconductor substrate, an MTJ element part formed over a part of the bottom electrode by lamination of a bottom magnetic film, an insulating film, a top magnetic film, and a top electrode in this order, and a protection film formed over the bottom electrode so as to cover the MTJ element part, wherein the bottom electrode is formed by amorphized metal nitride and the protection film is formed by an insulating film containing nitrogen.

6 Claims, 20 Drawing Sheets

FIG. 22

| SAMPLE | BOTTOM ELECTRODE EB1 | FILM THICKNESS | CMP AMOUNT | PROTECTION FILM 33 | OPTICAL INSPECTION (SiN PEELING) |
|---|---|---|---|---|---|
| 1 | TaN | 35nm | -5nm | 200C | 1 |
| 2 | TaN | 35nm | -5nm | 275C | 0 |
| 3 | Ta | 50nm | -20nm | 275C | 0 |
| 4 | Ta | 50nm | -20nm | 200C | 10 |
| 5 | LOW STRESS Ta | 50nm | -20nm | 275C | 10 OR MORE |
| 6 | LOW STRESS Ta | 30nm | — | 275C | 10 OR MORE |
| 7 | TaN | 35nm | — | 275C | 0 |

//

SEMICONDUCTOR DEVICE INCLUDING A MAGNETIC TUNNEL JUNCTION AND METHOD OF MANUFACTURING THE SAME

CROSS-REFERENCE TO RELATED APPLICATIONS

This application is a Continuation of U.S. application Ser. No. 12/474,974, filed on May 29, 2009, claiming priority of Japanese Patent Application No. 2008-204442, filed on Aug. 7, 2008, the entire contents of each of which are hereby incorporated by reference.

TECHNICAL FIELD

This invention relates to a semiconductor device having a memory element such as an MTJ (Magnetic Tunnel Junction) element, and relates to a manufacturing method thereof.

BACKGROUND OF THE INVENTION

An MRAM is a memory using a magnetic material for a memory element and storing data by a direction of magnetization of the magnetic material, that is, a memory retaining data by storing information in a spin of an electron, and has a circuit configured to be capable of random access. One of the memory element utilized for the MRAM is an MTJ element. Note that the present specification uses "MTJ element" as a concept including a TMR (Tunneling Magneto-Resistance) element.

A memory cell part of the MRAM is provided with a bottom electrode, a bottom magnetic film laminated over a part of the bottom electrode, a tunnel insulating film laminated over the bottom magnetic film, a top magnetic film laminated over the tunnel insulating film, a top electrode laminated over the top magnetic film, and a protection film formed over the bottom electrode so as to cover this laminated structure. Note that the MTJ element is composed of the above bottom magnetic film, tunnel insulating film, and top magnetic film.

Conventionally, Ta, Ti, or Cu, for example, has been used for the above bottom electrode and a nitride film or alumina, for example, has been used for the above protection film. As a prior art regarding such an MTJ element structure, Patent document 1 (Japanese patent laid-open No. 2007-158301) is known, for example.

SUMMARY OF THE INVENTION

Problem to be Solved by the Invention

In such an MTJ element, however, there is caused a failure that the protection film peels off from the bottom conductive layer when adhesion is low between the bottom conductive layer and the protection film, and there arises a problem that it is necessary to select a protection film of optimal material.

The peel-off of the protection film from the bottom electrode may be caused by the following reason. That is, the surface of the bottom electrode is damaged during formation of the bottom electrode, and, since the protection film is formed over the damaged surface, the protection film is likely to be peeled off. Then, the bottom electrode expands in volume due to heat treatment in the protection film formation and thereby the protection film peels off from the bottom electrode.

This invention has been made for solving the above problem and aims at providing a semiconductor device in which the adhesion is improved between the bottom electrode and the protection film protecting the MTJ element.

Means for Solving the Problem

According to a first aspect of this invention, a semiconductor device is provided with a bottom electrode formed over a semiconductor substrate, an MTJ element part formed over a part of the bottom electrode by lamination of a bottom magnetic film, an insulating film, a top magnetic film and a top electrode in this order, and a protection film formed over the bottom electrode so as to cover the MTJ element part, wherein the bottom electrode is formed by amorphized metal nitride and the protection film is formed by an insulating film containing nitrogen.

Advantage of the Invention

According to this first aspect, the bottom electrode is formed by the amorphized metal nitride and the protection film is formed by the insulating film containing nitrogen, and thereby the adhesion can be improved between the bottom electrode and the protection film. Accordingly, it is possible to prevent the protection film from peeling off from the bottom electrode and also to prevent foreign material ($H_2$, $H_2O$, etc.) from intruding through an interface between the bottom electrode and the protection film, and thereby suppressing deterioration of characteristics of the MTJ element.

BRIEF DESCRIPTION OF THE DRAWINGS

FIG. 22 is a diagram showing experimental data of a semiconductor device according to Embodiment 1;

DETAILED DESCRIPTION OF THE PREFERRED EMBODIMENTS

Embodiment 1

Figure 1:
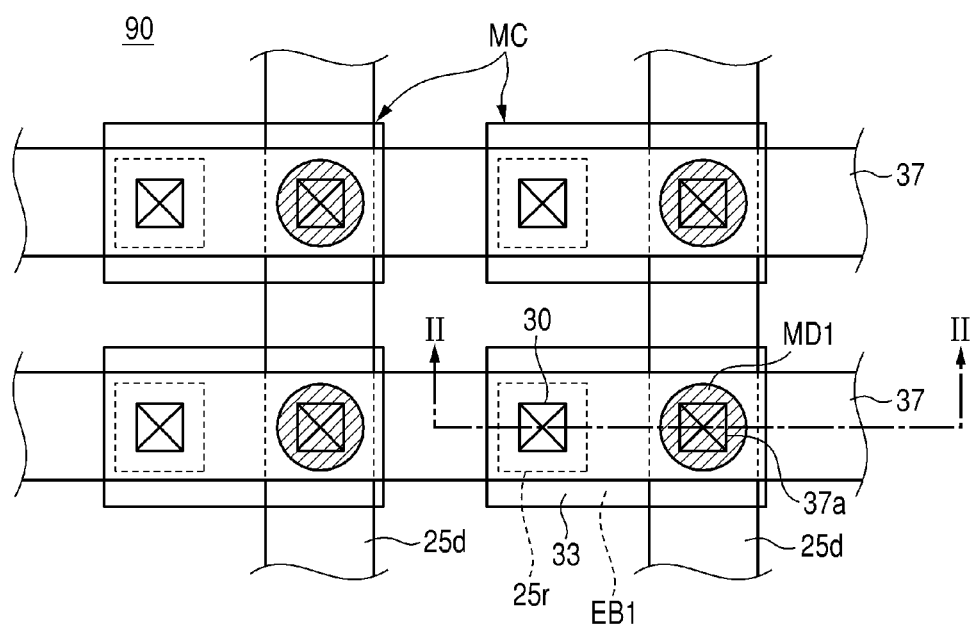
FIG. 1 is a plan view showing a planer structure in an MTJ element part in each of semiconductor devices 90 and 90B according to Embodiments 1 and 2, respectively.
Figure 2:
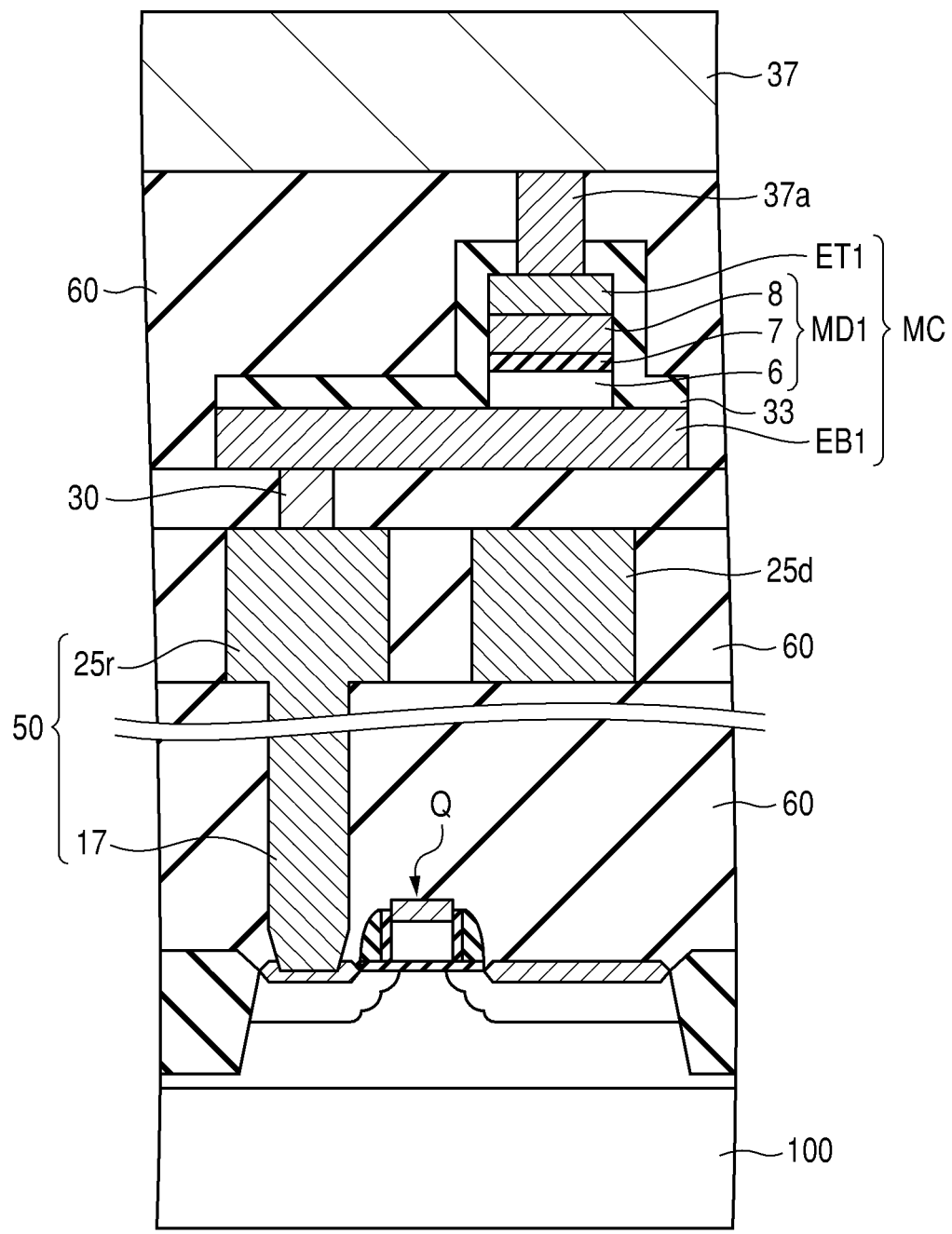
FIG. 2 is a cross-sectional view showing the II-II cross-section of FIG. 1 in the case of Embodiment 1.

<Configuration> A semiconductor device 90 according to this embodiment is a magnetic memory device (MRAM) using the MTJ element and provided with a plurality of bit lines 37, a plurality of digit lines 25*d*, a memory cell part MC including an MTJ element MD1, and a MOS transistor Q (FIG. 2) controlling ON and OFF of a current flowing in the MTJ element MD1, as shown in FIG. 1 and FIG. 2.

The respective bit lines 37 are arranged in parallel over the horizontal plane having a spacing therebetween. The respective digit lines 25*d* are arranged in parallel over the horizontal plane under the bit lines 37 having a spacing therebetween and also arranged so as to intersect the bit lines 37 perpendicularly.

The memory cell part MC, as shown in FIG. 2, is provided with a bottom electrode EB1 having a horizontally long rectangular shape in a planar view, a bottom magnetic film (Pin layer) 6 which is laminated on a part of the bottom electrode EB1 upper surface on one end side and has a vertically long ellipsoidal shape in a planar view, a tunnel insulating film 7 laminated over the bottom magnetic film 6, a top magnetic film (Free layer) 8 laminated over the tunnel insulating film 7, a top electrode ET1 laminated over the top magnetic film 8, and a protection film 33 formed over the bottom electrode EB1 so as to cover this laminated structure. Note that the MTJ element MD1 is composed of the bottom magnetic film 6, the tunnel insulating film 7, and the top magnetic film 8, and the MTJ element part is composed of the MTJ element MD1 and the top electrode ET1.

The amorphized metal nitride (e.g., TaN or WN) is used for the bottom electrode EB1. The thickness of the bottom electrode EB1 is preferably 20 to 100 nm from the view point of a magnitude of resistance and peeling prevention of the protection film 33. If the thickness is smaller than 20 nm, there is a possibility that the bottom electrode EB1 becomes too thin by erosion in an etching process forming the bottom magnetic film 6, and if the thickness is larger than 100 nm, there is a possibility that stress in the bottom electrode EB1 becomes too high and the protection film 33 peels off.

Pt, Ru, Mn, Co, Fe, a compound thereof, or the like, for example, is used for the bottom magnetic film 6. Al-oxide, Mg-oxide, or the like, for example, is used for the tunnel insulating film 7. Co, Fe, a compound thereof, or the like is used for the top magnetic film 8. Ta, Ru, a laminated film thereof, or the like is used for the top electrode ET1.

An insulating film containing nitrogen (nitride film, specifically silicon nitride, for example) is used for the protection film 33. The thickness of the protection film 33 is preferably 50 to 100 nm from the viewpoint of oxidation prevention of the MTJ element MD1, the top electrode ET1, and the bottom electrode EB1.

This memory cell part MC is disposed at the intersection of the digit line 25*d* and the bit line 37 between both of the lines 25*d* and 37. In more detail, the memory cell part MC is disposed such that the MTJ element MD1 thereof is disposed at the intersection of both of the lines 25*d* and 37 between both of the lines 25*d* and 37 and also the bottom electrode EB1 thereof is disposed along the bit line 37.

The upper surface of the top electrode ET1 is coupled to the bit line 37 via an upper contact 37*a*. Further, the lower surface of the bottom electrode EB1 is coupled to a wiring 50 via a lower contact 30. Note that the wiring 50 is connected to one of source and drain regions of the MOS transistor Q.

The MOS transistor Q is formed over a semiconductor substrate 100 (FIG. 2). An interlayer insulating film 60 is formed over the semiconductor substrate 100 so as to cover the MOS transistor Q, and the digit line 25*d*, the memory cell part MC, and the wiring 50 are embedded in this interlayer insulating film 60.

In this semiconductor device 90, the nitride film is used for the protection film 33 and the amorphized metal nitride is used for the bottom electrode EB1. Nitriding of a metal used for the bottom electrode EB1 generates a coupling between nitrogen on the side of bottom electrode EB1 and nitrogen on the side of protection film 33 and improves the adhesion between the bottom electrode EB1 and the protection film 33. Further, amorphizing of a metal used for the bottom electrode EB1 generates a dangling bond (uncoupled hand) over the surface of the bottom electrode EB1, and the protection film 33 is coupled with the dangling bond of the bottom electrode EB1 when the protection film 33 is formed over the bottom electrode EB1, resulting in improvement of the adhesion between the bottom electrode EB1 and the protection film 33.

Further, the amorphizing of the bottom electrode EB1 makes the surface of the bottom electrode EB1 resistant to being damaged during the formation of the bottom electrode EB1, and also makes the bottom electrode EB1 resistant to being expanded in volume by the heat treatment in the formation of the protection film 33. Thereby, the protection film 33 becomes resistant to the peeling from the bottom electrode EB1.

<Manufacturing method> FIG. 3 to FIG. 21 are cross-sectional views showing a manufacturing method of the semiconductor device 90 of Embodiment 1. Note that each of FIG. 3 to FIG. 21 corresponds to the II-II cross-section of FIG. 1. Hereinbelow, the manufacturing method of the semiconductor device of Embodiment 1 will be described with reference to FIG. 3 to FIG. 21.

Figure 3:
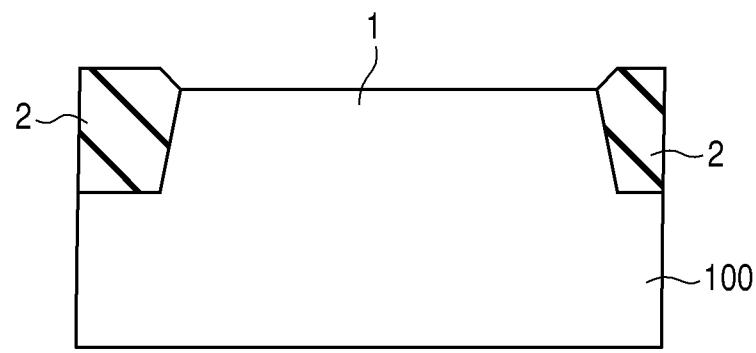
FIG. 3 is a cross-sectional view showing a manufacturing method in Embodiment 1.

First, as shown in FIG. 3, an element isolation region is formed selectively in the upper layer of the semiconductor substrate 100. The upper layer of the semiconductor substrate 100 between the element isolation regions 2 and 2 becomes an active region 1 where the transistor and the like are formed.

Figure 4:
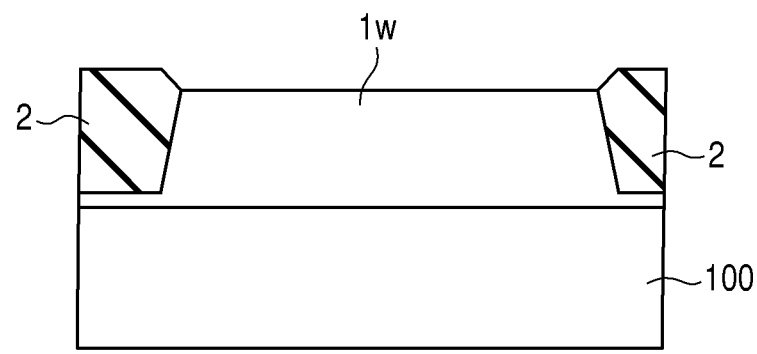
FIG. 4 is a cross-sectional view showing a manufacturing method in Embodiment 1.

Then, as shown in FIG. 4, a well region 1*w* is formed in the upper layer of the semiconductor substrate 100 by introduction of an impurity of a first conductivity type.

Figure 5:
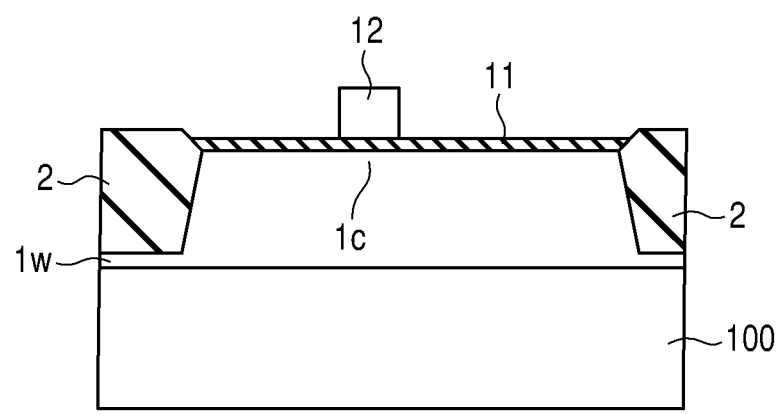
FIG. 5 is a cross-sectional view showing a manufacturing method in Embodiment 1.

Next, as shown in FIG. 5, a gate insulating film 11 is formed over the well region 1*w*, and a gate electrode 12 is formed selectively over the gate insulating film 11. The surface of the well region 1*w* under the gate electrode 12 is defined as a channel region 1*c*.

Figure 6:
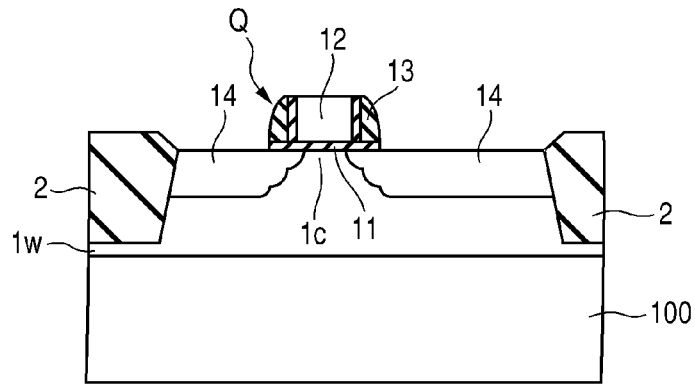
FIG. 6 is a cross-sectional view showing a manufacturing method in Embodiment 1.

Subsequently, as shown in FIG. 6, an impurity of a second conductivity type (opposite conductivity type to the first conductivity type) is implanted and diffused into the gate electrode 12 in a self alignment manner, and then a side wall 13 having a two-layer structure is formed on the lateral side of the gate electrode 12. After that, the impurity of second conductivity type is implanted and diffused into the gate electrode 12 and the side wall 13 in a self alignment manner to form a pair of source and drain regions 14 and 14, which has an extension region near the channel region 1c. As a result, the MOS transistor Q is formed which is composed of the channel region 1c, the gate insulating film 11, the gate electrode 12, and the source and drain regions 14.

Figure 7:
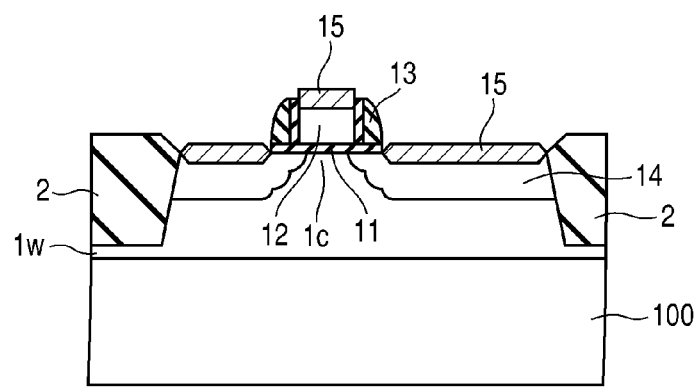
FIG. 7 is a cross-sectional view showing a manufacturing method in Embodiment 1.

Next, as shown in FIG. 7, a cobalt silicide region 15 is formed over each surface of the source and drain regions 14 and 14 and the gate electrode 12.

Figure 8:
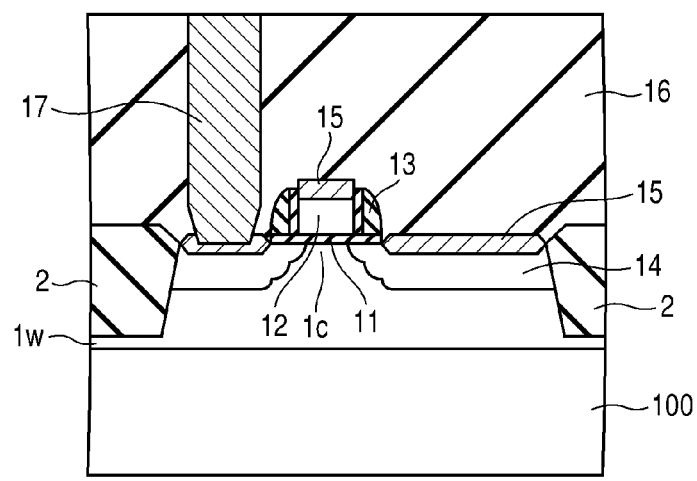
FIG. 8 is a cross-sectional view showing a manufacturing method in Embodiment 1.

Subsequently, as shown in FIG. 8, an interlayer insulating film 16 is formed over the entire surface, and a contact plug 17 is formed selectively penetrating through the interlayer insulating film 16. This contact plug 17 is electrically connected to one cobalt silicide region 15 of the pair of source and drain regions 14 and 14.

Figure 9:
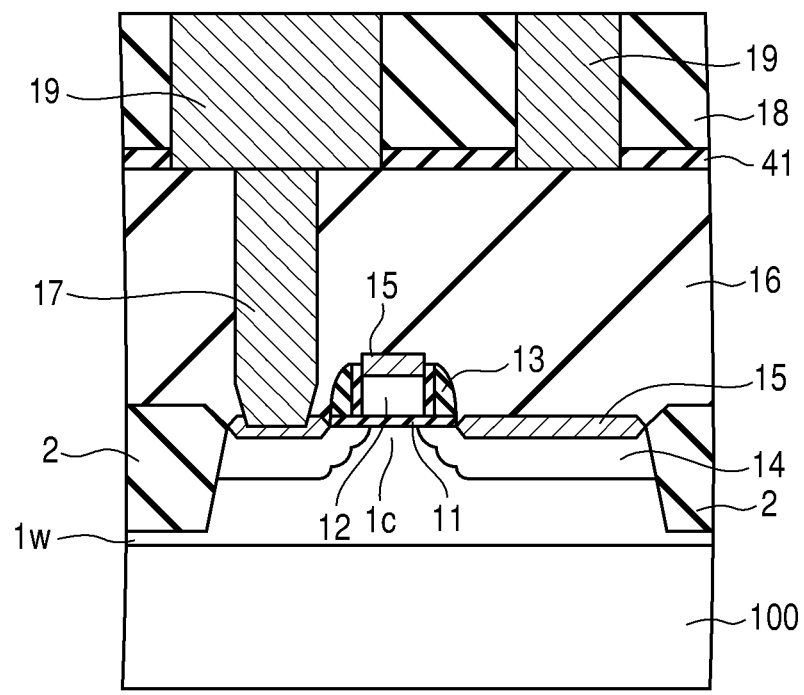
FIG. 9 is a cross-sectional view showing a manufacturing method in Embodiment 1.

Further, as shown in FIG. 9, a nitride film 41 and an interlayer insulating film (oxide film) 18 are laminated over the entire surface, and a Cu wiring 19 is formed selectively penetrating through the nitride film 41 and the interlayer insulating film 18. As a result, a part of the Cu wiring 19 is electrically connected to the contact plug 17. In this manner, the Cu wiring 19 is formed as the first layer metal wiring.

Figure 10:
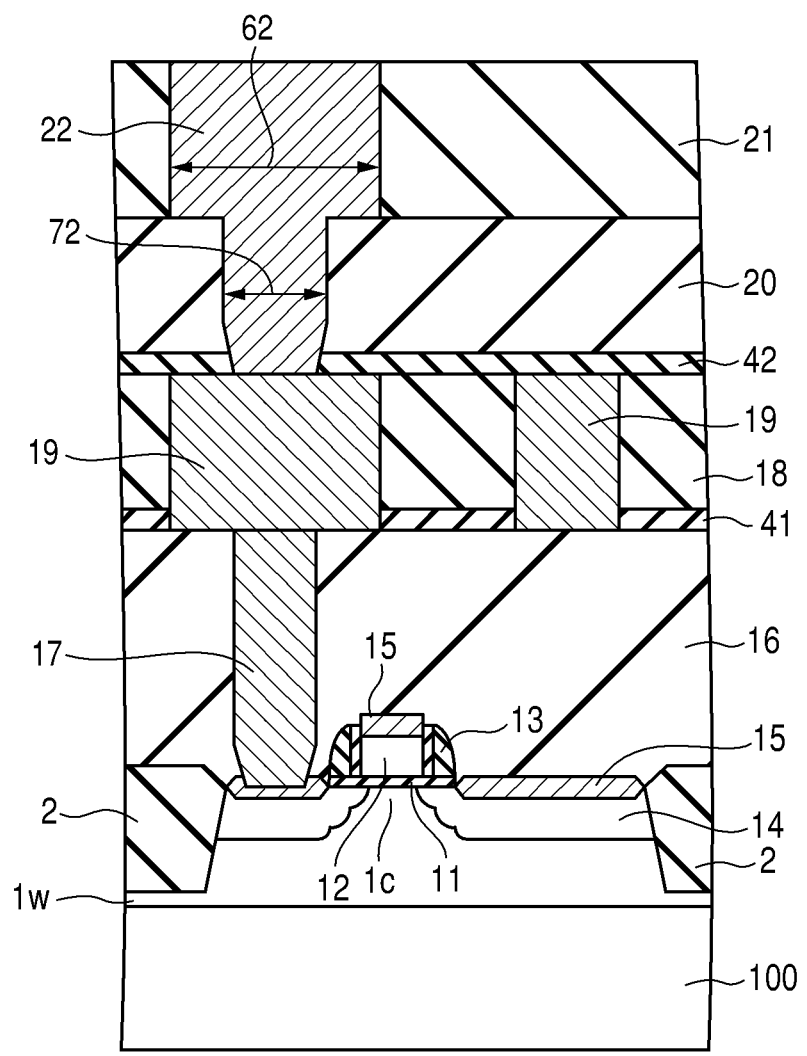
FIG. 10 is a cross-sectional view showing a manufacturing method in Embodiment 1.

Subsequently, as shown in FIG. 10, a nitride film 42 and interlayer insulating films (oxide films) 20 and 21 are laminated over the entire surface, and a fine hole 72 is formed selectively penetrating through the nitride film 42 and the interlayer insulating film 20 and further an interconnection hole 62 is formed selectively penetrating through the interlayer insulating film 21 over a region including the fine hole 72. After that, a Cu wiring 22 is formed filling the fine hole 72 and the interconnection hole 62. The Cu wiring 22 is electrically connected to the Cu wiring 19 (Cu wiring 19 electrically connected to the contact plug 17). In this manner, the Cu wiring 22 is formed as the second layer metal wiring by use of a damascene technique.

Figure 11:
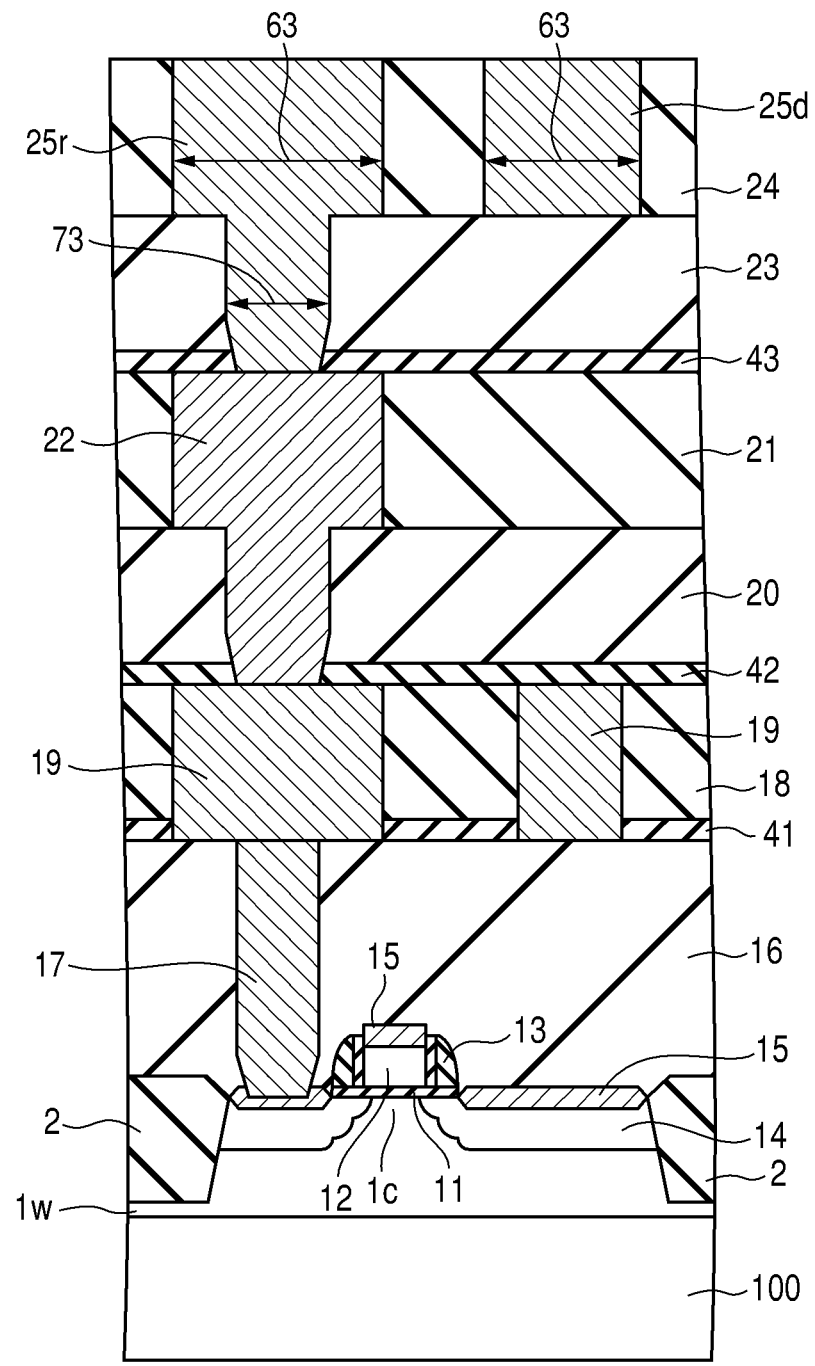
FIG. 11 is a cross-sectional view showing a manufacturing method in Embodiment 1.

After that, as shown in FIG. 11, a nitride film 43 and interlayer insulating films (oxide films) 23 and 24 are formed over the entire surface and a fine hole 73 is formed selectively penetrating through the nitride film 43 and the interlayer insulating film 23 and further an interconnection hole 63 is formed selectively penetrating through the interlayer insulating film 24 over a region including the fine hole 73. After that, a Cu wiring 25 (lead line 25r and digit line 25d (word line)) is formed filling the fine hole 73 and the interconnection hole 63. Then, the lead line 25r is electrically connected to the Cu wiring 22. In this manner, the Cu wiring 25 is formed as the third layer metal wiring using the damascene technique.

Figure 12:
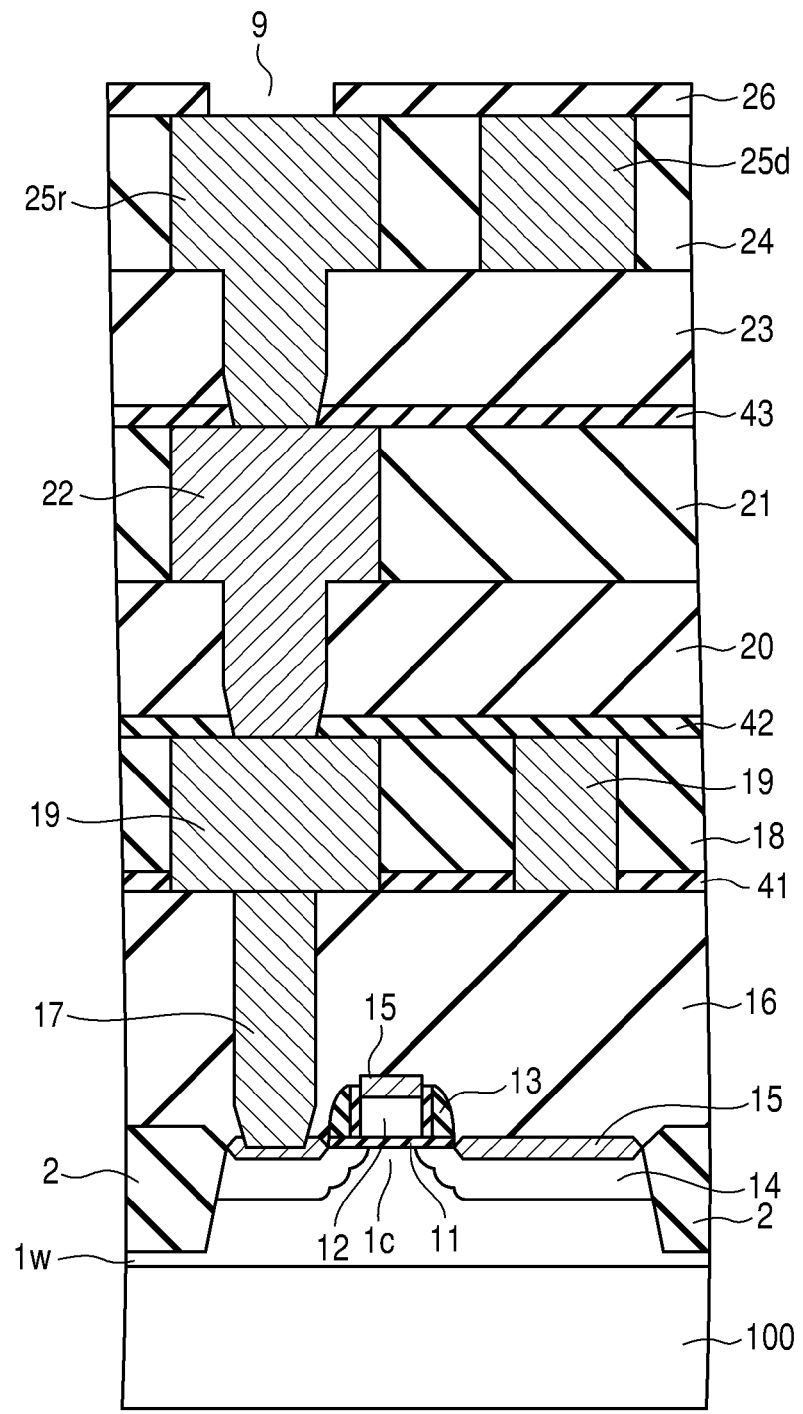
FIG. 12 is a cross-sectional view showing a manufacturing method in Embodiment 1.

After that, as shown in FIG. 12, an interlayer insulating film 26 which is a silicon nitride film is formed over the entire surface, and a via hole 9 is formed penetrating through the interlayer insulating film 26 on a part of a region of the lead line 25r.

Figure 13:
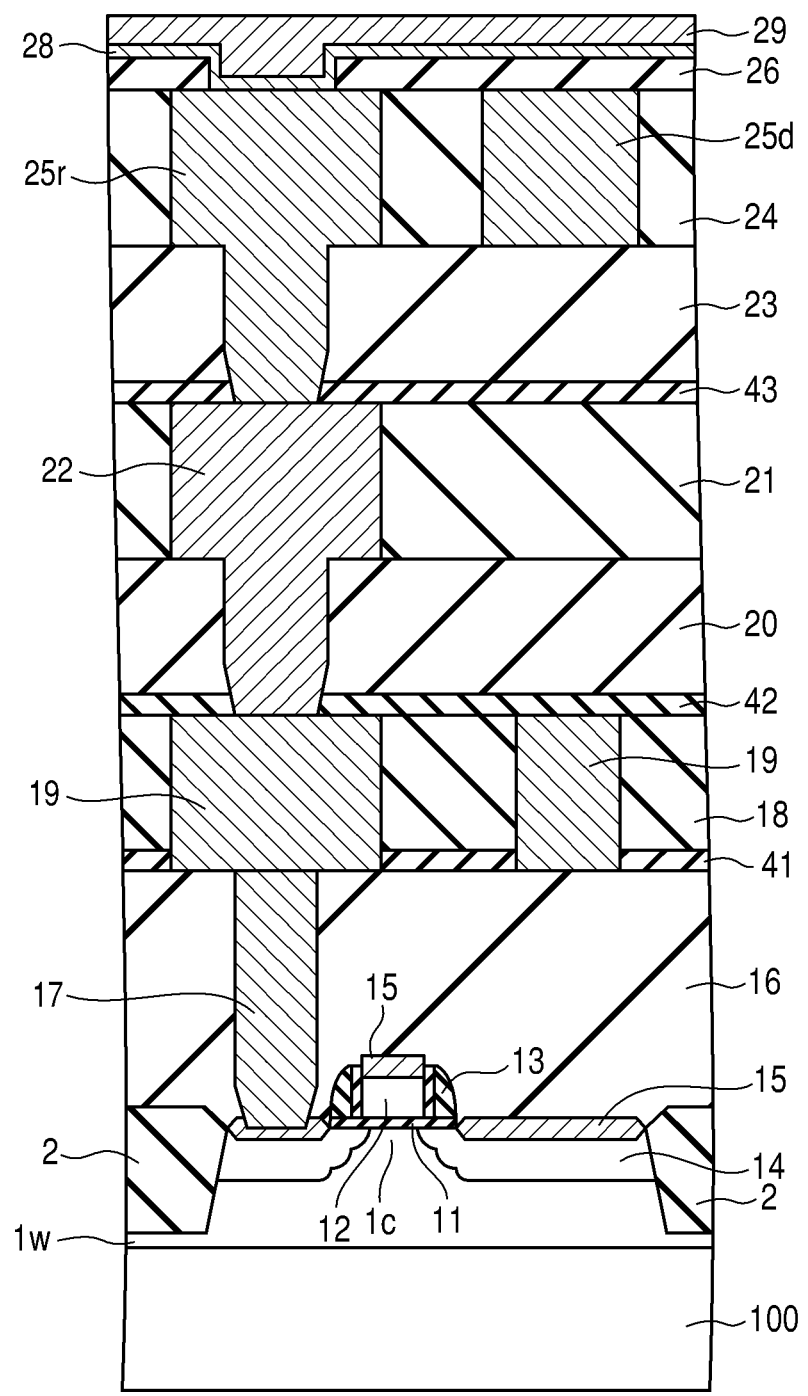
FIG. 13 is a cross-sectional view showing a manufacturing method in Embodiment 1.

Then, as shown in FIG. 13, a barrier metal layer 28 is formed over the entire surface including the inside of the via hole 9, and a via filling metal layer 29 is formed over the barrier metal layer 28.

Figure 14:
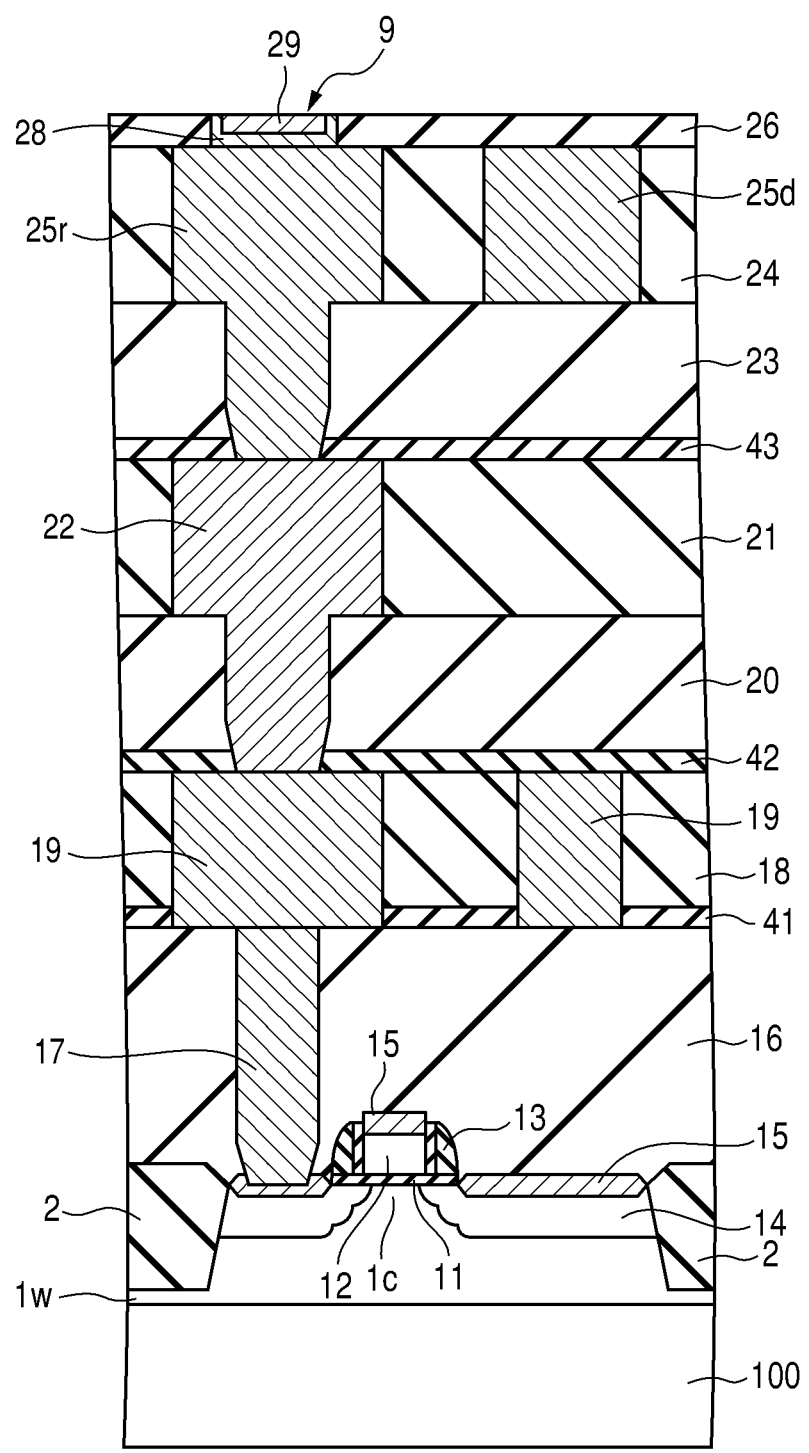
FIG. 14 is a cross-sectional view showing a manufacturing method in Embodiment 1.

Subsequently, as shown in FIG. 14, the barrier metal layer 28 and the via filling metal layer 29 are subjected to CMP processing to leave only the barrier metal layer 28 within the via hole 9 and the via filling metal layer 29.

Figure 15:
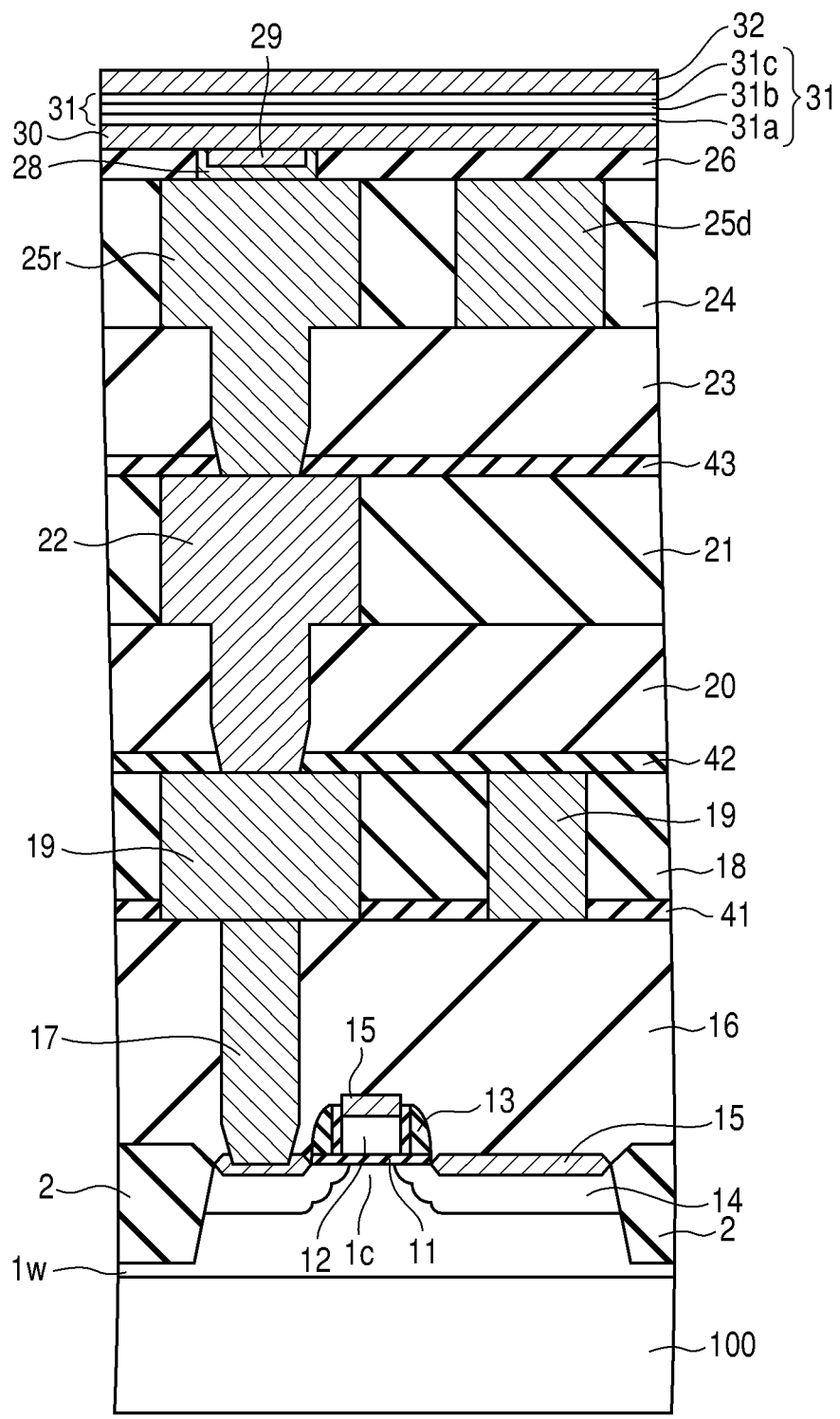
FIG. 15 is a cross-sectional view showing a manufacturing method in Embodiment 1.

After that, as shown in FIG. 15, a bottom electrode layer 30, a bottom magnetic layer 31a, a tunnel insulating film 31b, a top magnetic film 31c and a top electrode layer 32 are laminated over the entire surface. Hereinafter, the bottom magnetic layer 31a, the tunnel insulating film 31b, and the top magnetic film 31c are called a MTJ film 31.

In this process, the amorphized metal nitride (e.g., Ta or WN) is used as the composition material of the bottom electrode EB1, Pt, Ru, Mn, Co, Fe, a compound thereof, or the like, for example, is used as the composition material of the bottom magnetic film 6, Al-oxide, Mg-oxide, or the like, for example, is used as the composition material of the tunnel insulating film 7, Co, Fe, a compound thereof, or the like is used as the composition material of the top magnetic film 8, and Ta, Ru, a laminated film thereof, or the like is used as the composition material of the top electrode ET1. The bottom electrode EB1 and the top electrode ET1 are formed by a sputtering method, for example.

Figure 16:
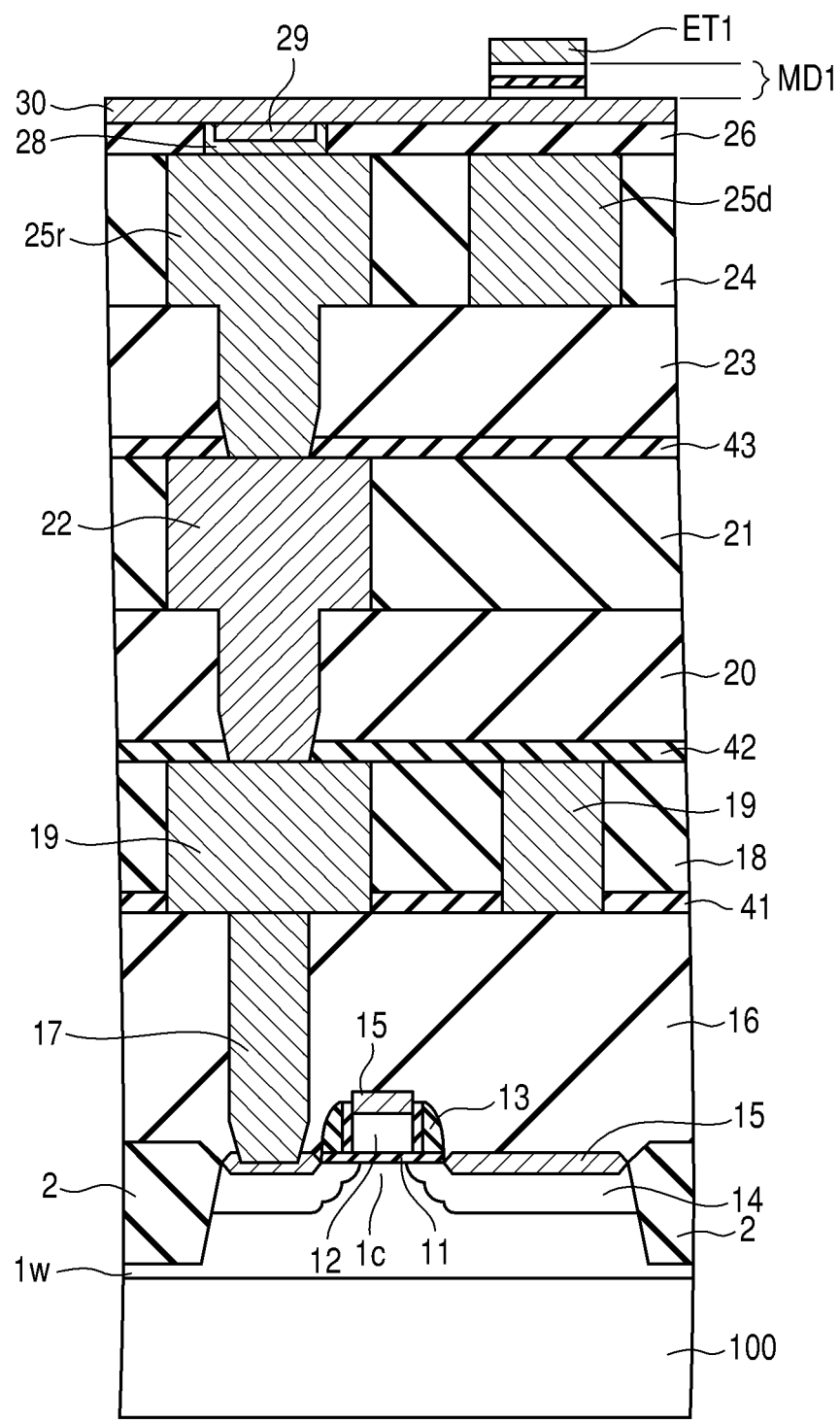
FIG. 16 is a cross-sectional view showing a manufacturing method in Embodiment 1.

Subsequently, as shown in FIG. 16, the MTJ film 31 and the top electrode layer 32 are patterned by use of a patterned resist which is not shown in the drawing, and the MTJ element MD1 and the top electrode ET1 are obtained. These MTJ element MD1 and top electrode ET1 become the MTJ element part.

Figure 17:
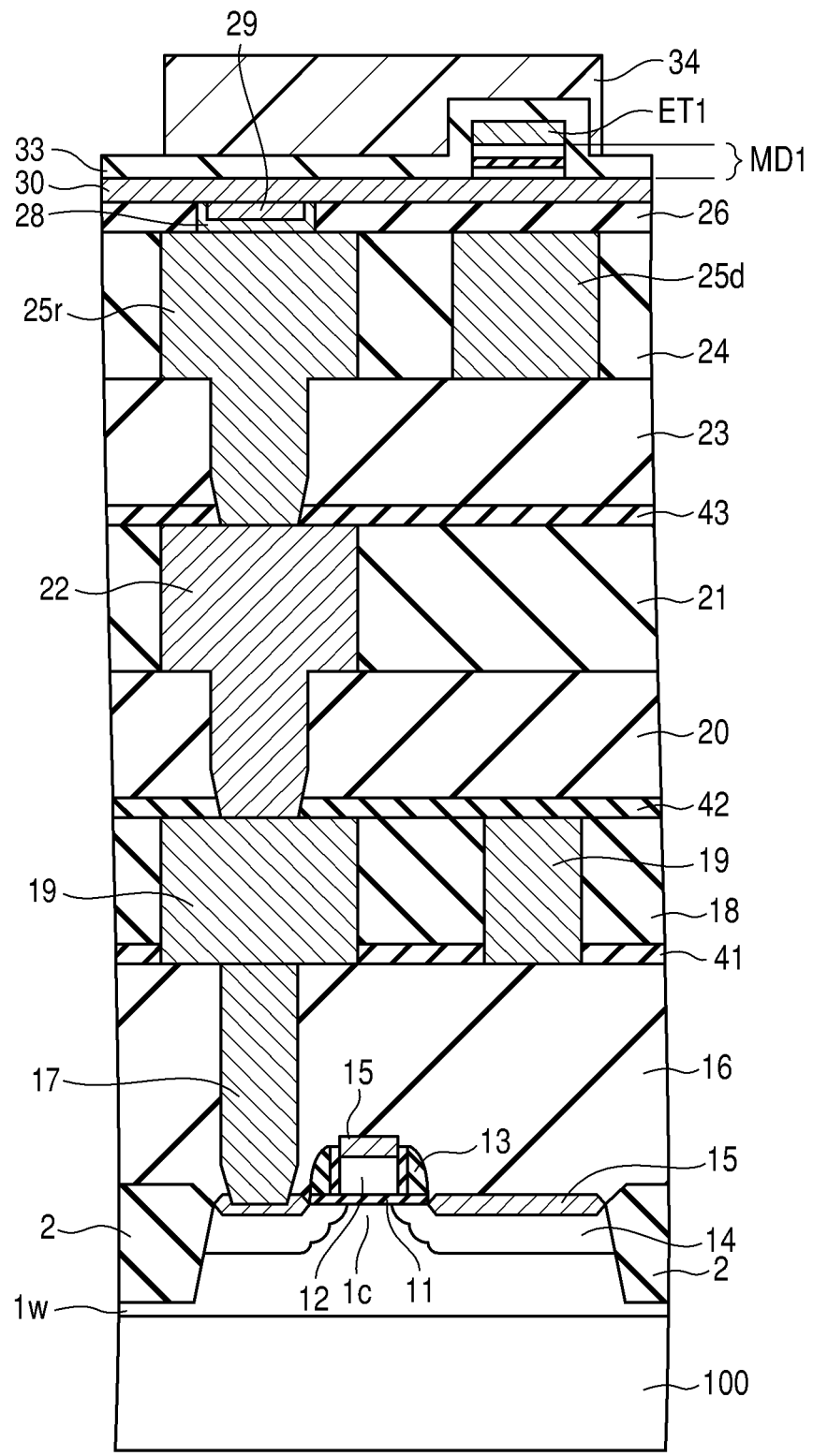
FIG. 17 is a cross-sectional view showing a manufacturing method in Embodiment 1.

Next, as shown in FIG. 17, a nitride film (e.g., silicon nitride film) is formed as the protection film 33 over the bottom. electrode 30 so as to cover the MTJ element part (MTJ element MD1 and top electrode ET1). In this process, the protection film 33 is formed at a temperature which does not affect the electro-magnetic characteristics of the magnetic material composing the MTJ element MD1 (e.g., temperature of 300° C. or lower). In this condition, since the protection film 33 is formed by the nitride film and also the bottom electrode 30 is formed by the amorphized metal nitride, the protection film 33 is formed strongly adhered to the bottom electrode 30. Note that the protection film 33 is also called a silicon nitride film 33, hereinafter.

Then, a resist pattern 34 is formed selectively over the silicon nitride film 33 by use of a lithography technique.

Figure 18:
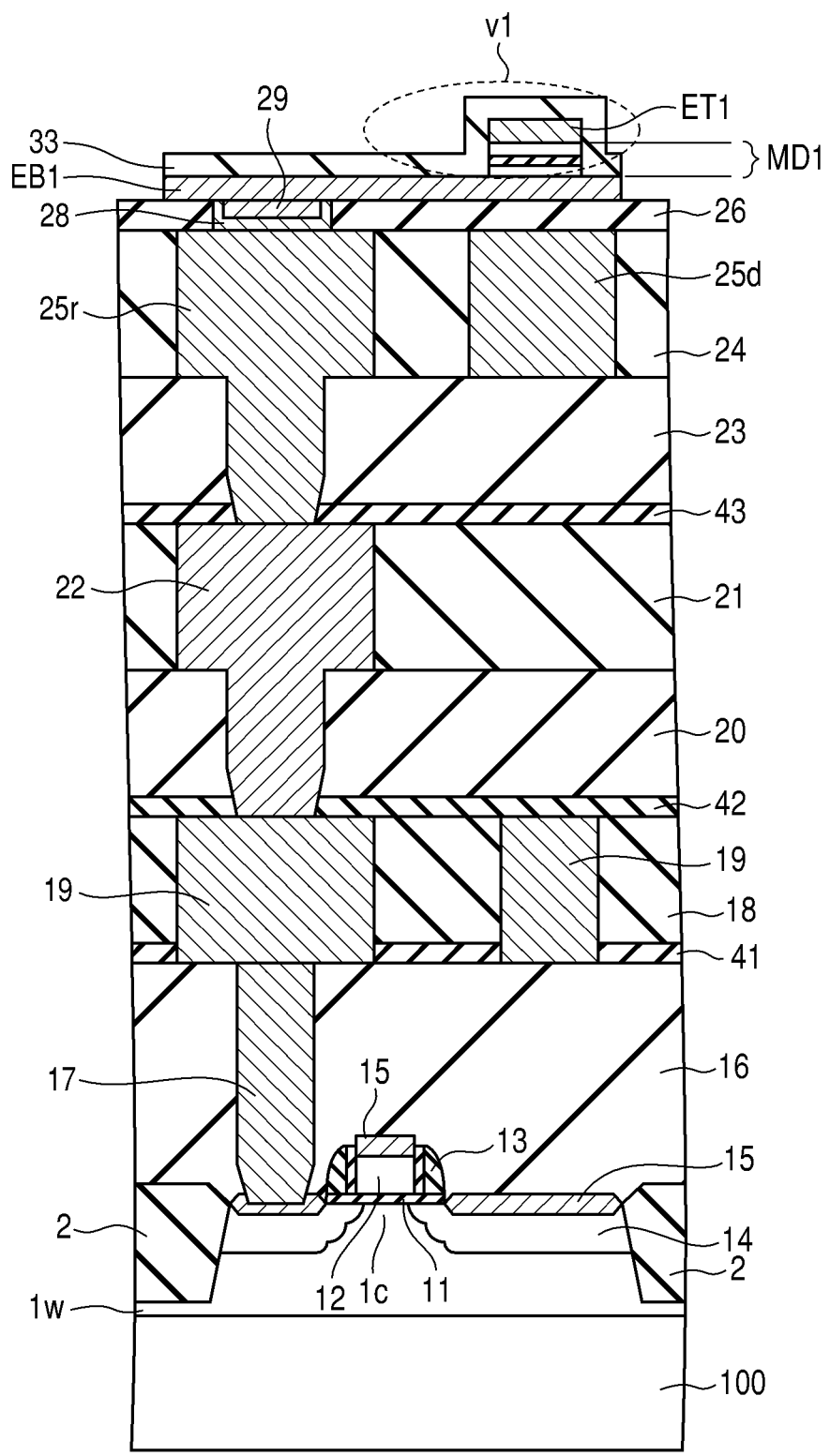
FIG. 18 is a cross-sectional view showing a manufacturing method in Embodiment 1.

Further, as shown in FIG. 18, the silicon nitride film 33 and the bottom electrode layer 30 are patterned by use of a dry etching technique utilizing the resist pattern 34 as a mask, and the patterned silicon nitride film 33 and the bottom electrode EB1 are obtained.

Since the silicon nitride film 33 and the bottom electrode layer 30 are patterned at the same time in this manner, the surface and the lateral side of the MTJ element MD1 are protected by the silicon nitride film 33 in the patterning of the bottom electrode layer 30. Thereby, it is possible to effectively suppress leak current generation of the MTJ element MD1 caused by a residual of the bottom electrode layer 30 attached to the lateral side of the MTJ element MD1 or the like.

Figure 19:
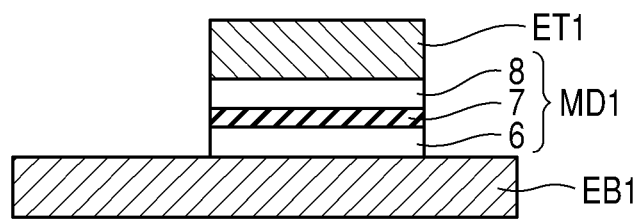
FIG. 19 is a cross-sectional view showing a manufacturing method in Embodiment 1.

FIG. 19 is an explanatory diagram showing an enlarged structure of the focused region v1 of FIG. 18. Note that illustration of the silicon nitride film 33 is omitted from the drawing. As shown in the drawing, the MTJ element part composed of the MTJ element MD1 and the top electrode ET1 can be obtained over the bottom electrode EB1. Note that the detailed structure of the MTJ element MD1 is the laminated structure of the bottom magnetic film 6 (Pin layer), the tunnel insulating film 7, and the top magnetic film 8 (Free layer).

Figure 20:
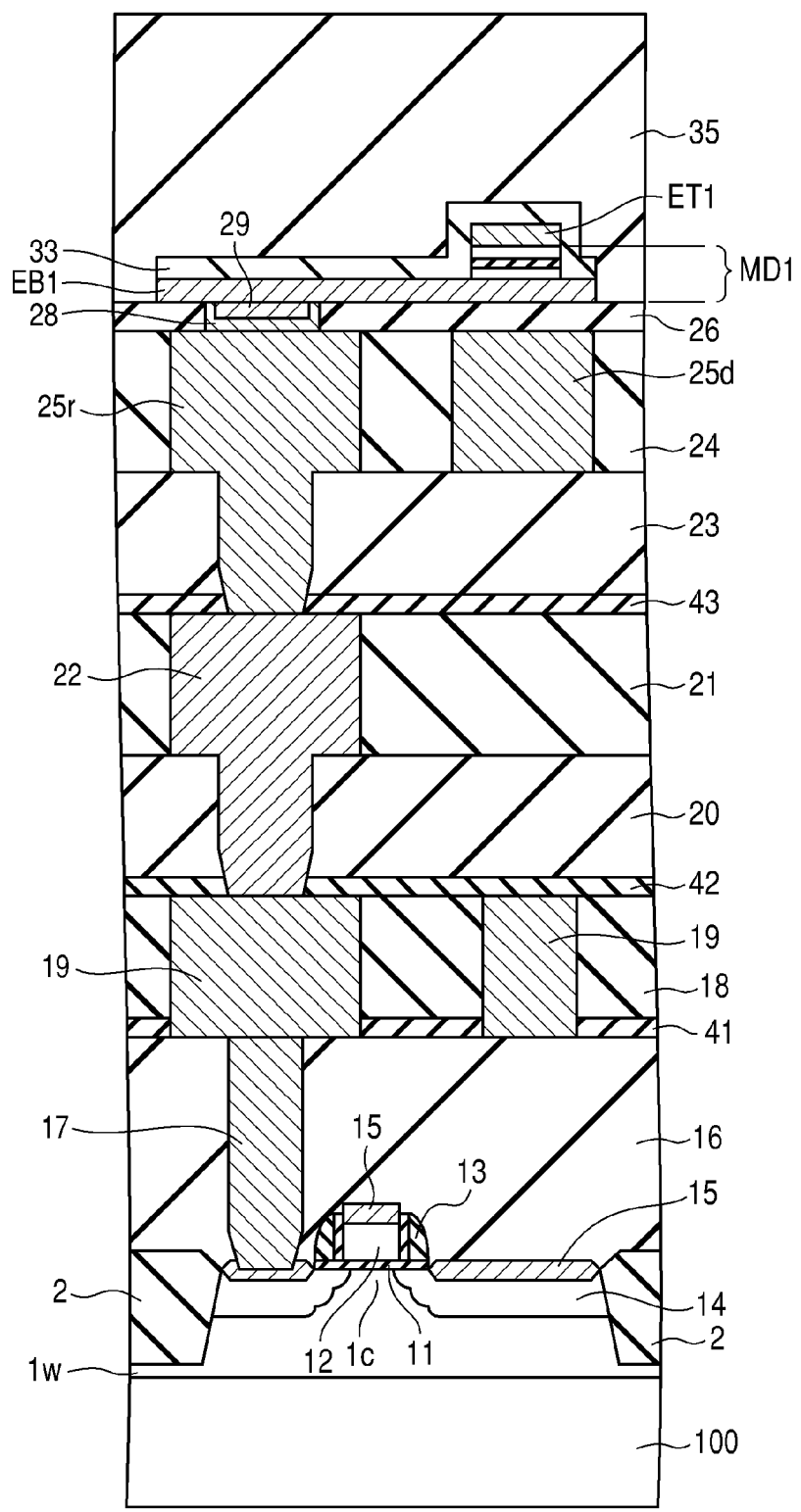
FIG. 20 is a cross-sectional view showing a manufacturing method in Embodiment 1.

Next, as shown in FIG. 20, an interlayer insulating film 35 made of $SiO_2$ is formed over the entire surface. In this process, even if hydrogen and water diffuse from the interlayer insulating film 35, a magnetic damage thereof to the MTJ element MD1 can be suppressed by the existence of the silicon nitride film 33.

Figure 21:
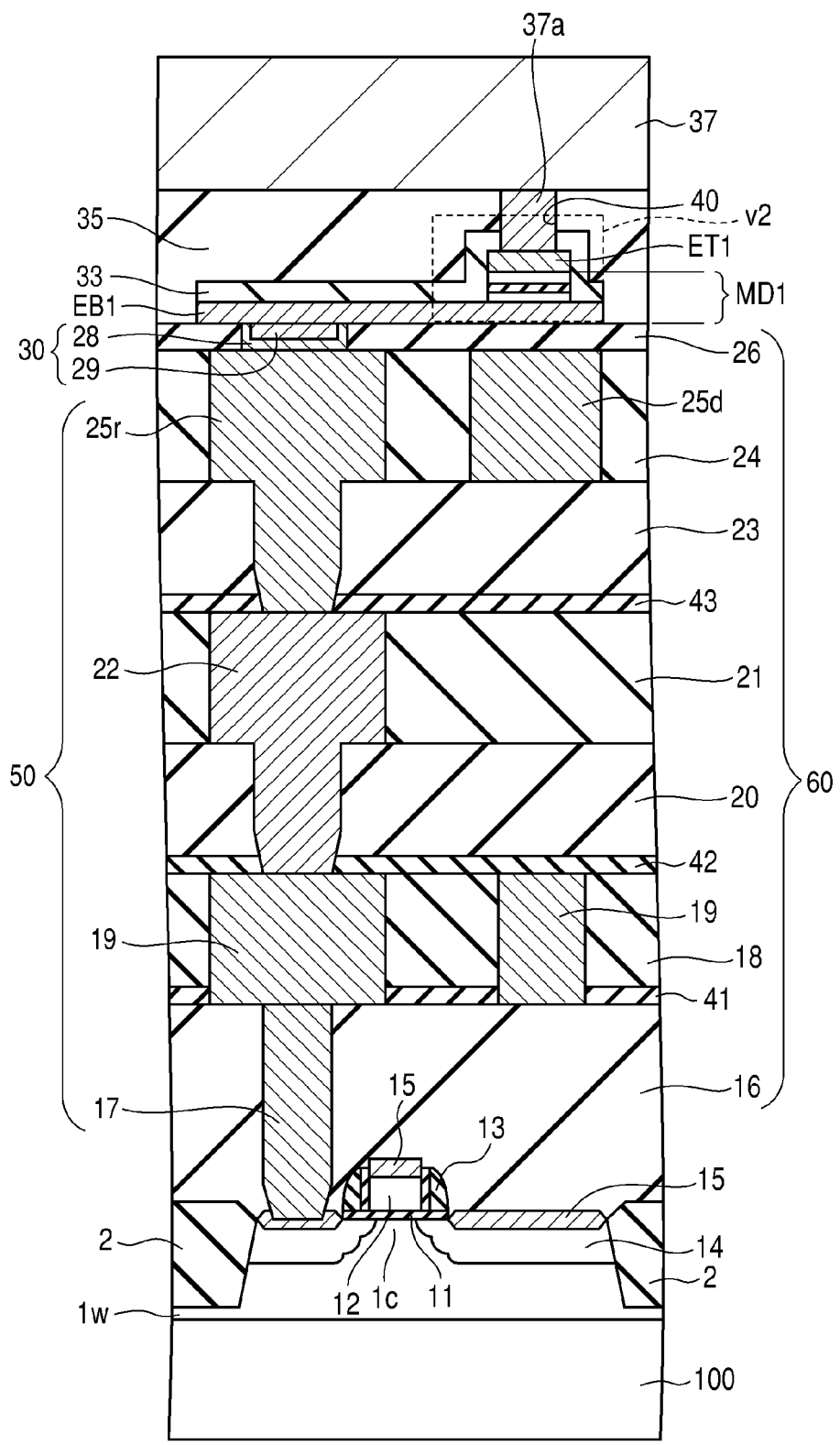
FIG. 21 is a cross-sectional view showing a manufacturing method in Embodiment 1.

After that, as shown in FIG. 21, the interlayer insulating film 35 is subjected to the CMP processing for planarization of the interlayer insulating film 35. Subsequently, a via hole 40 is formed selectively over the top electrode ET1 penetrating through the silicon nitride film 33 and the interlayer insulating film 35. At this time, the silicon nitride film 33 functions as a stopper film for making the through hole in the interlayer insulating film 35.

Next, a Cu wiring 37a (upper contact) is embedded in the via hole 40 and also a Cu wiring 37 (bit line) is formed over the interlayer insulating film 35. As a result, the Cu wiring 37 is electrically connected to the top electrode ET1 of the MTJ element MD1 through the via hole 40. In this manner, the Cu wiring 37 is formed as the fourth layer metal wiring.

Lastly, an interlayer insulating film (not shown in the drawing) is formed over the entire surface and the semiconductor device 9, which is shown in FIG. 1 and FIG. 2, is completed using the memory cell part MC composed of the bottom electrode EB1, the MTJ element MD1, the top electrode ET1, and the protection film 33. Note that the wiring 50 in FIG. 2 is composed of the respective parts 17, 19, 22, and 25r. In addition, the interlayer insulating film 60 in FIG. 2 is composed of the respective parts 16, 18, 20, 21, 23, 24, and 26.

In the following, film forming methods will be described in detail for the bottom electrode EB1 and the protection film 33.

First a film forming method of the bottom electrode EB1 will be described in detail. The bottom electrode EB1 is formed by the amorphized metal nitride (e.g., TaN or WN) by use of a reactive sputtering.

An rf magnetron sputtering apparatus (base vacuum: $2 \times 10^{-7}$ Torr and output: 150 W), for example, can be used as a film forming apparatus for the bottom electrode EB1. When the bottom electrode EB1 is formed by TaN, for example, Ta is used for a target and a gas mixture of Ar and $N_2$, for example, is used for a sputter gas. At this time, a total flow amount of the gas mixture is 20 sccm, for example, and the flow rate of the gas mixture is Ar:$N_2$=17:3, for example (nitrogen may be increased from this rate).

By the sputtering in this condition, as shown in FIG. 15, the bottom electrode 30 made of the amorphized TaN is formed over the entire surface of the interlayer insulating film 26 so as to cover the respective parts 28 and 29. Here, the bottom electrode 30 is formed so as to have a thickness of 20 to 100 nm, for example.

That is, Ta atom is nitrided by increase of nitrogen to more than a certain amount in the sputtering atmosphere, and also nitrided Ta atom is amorphized and formed in a film state over the entire surface of the interlayer insulating film 26. When a metal other than Ta (e.g., W) is used, the amorphized metal nitride is also formed by appropriate adjustment of the nitrogen ratio.

Next, a film forming method of the protection film 33 will be described in detail. The protection film 33 is formed by the nitride film (here, silicon nitride film). In the following, the silicon nitride film 33 is formed so as to satisfy first and second conditions to be described below. When nitrogen is contained in a film forming gas for the silicon nitride film 33, the magnetic film of the MTJ element MD1 is nitrided by the nitrogen and the magnetization of the MTJ element MD1 is deteriorated, and therefore a gas without containing $NH_3$ is used as the film forming gas (first condition). Further, the silicon nitride film is formed at a film forming temperature not more than 200 to 350° C. for preventing the magnetization deterioration of the MTJ element MD1 (second condition).

A parallel plate type plasma CVD apparatus, for example, can be used as a film forming apparatus for the silicon nitride film 33. A film forming gas of $SiH_4/N_2$/helium (He) is used for satisfying the above first condition that $NH_3$ is not to be contained. For example, the flow rate of $SiH_4$, $N_2$, and He can be set to be 1 to 500 sccm, 80 to 40,000 sccm, and 100 to 50,000 sccm, respectively.

Further, the film forming pressure, the electrode spacing between the parallel plates in the parallel plate type plasma CVD apparatus, and the RF power are set to be 1 to 20 Torr, 5 to 15 mm, and 0.1 to 10 W/cm$^2$, respectively. In addition, the film forming temperature is set to be 200 to 350° C. for satisfying the above second condition.

Note that the upper limit temperature which does not affect the electro-magnetic characteristics of the magnetic material for the MTJ element MD1 is 300° C. in the case that aluminum oxide (AlOx) such as alumina ($Al_2O_3$) is used as the composition material of the tunnel insulating film 7 which composes the MTJ element MD1, and 350° C. in the case that magnesium oxide (MgO) is used as the composition material of the tunnel insulating film 7.

Accordingly, when the silicon nitride film 33 is formed in consideration of the above second condition, 200 to 300° C. is an ideal film forming temperature in the case that AlOx is used as the composition material of the tunnel insulating film 7 composing the MTJ element MD1, and 200 to 350° C. is an ideal film forming temperature in the case that MgO is used as the composition material of the tunnel insulating film 7.

The reason why the upper limit temperature is different between AlOx and MgO as the composition material of the tunnel insulating film 7 is as follows. AlOx is used in an amorphous state and MgO is used in a crystal state for the tunnel insulating film 7 (tunnel barrier). Therefore, MgO needs annealing for crystallization which requires an annealing temperature of about 350° C. However, too high annealing temperature deteriorates the magnetic characteristics of the Pin layer in the MTJ element MD1 and the upper limit temperature is set to be 350° C. in consideration of this point. On the other hand, AlOx does not need the crystallization annealing since AlOx is used in the amorphous state. Accordingly, the upper limit temperature is set to be 300° C., since a low temperature process around 300° C. is required here.

Further, the reason why the lower limit of the film forming temperature is set to be 200° C. or higher is that it is practically difficult to form the silicon nitride film 33 at a film forming temperature lower than 200° C. using the parallel plate type plasma CVD apparatus. The silicon nitride film is formed as the protection film 33 under such a condition.

<Experimental data> FIG. 22 shows an experimental result verifying the improvement in the adhesion between the bottom electrode EB1 and the protection film 33 in the semiconductor device 90.

Sample 1 is obtained in the following condition. That is, in the semiconductor device 90, amorphized TaN is used as the composition material of the bottom electrode EB1, the bottom electrode EB1 is polished by 5 nm by use of the CMP to have a final thickness of 35 nm, the silicon nitride film is used as the composition material of the protection film 33, and a heat treatment temperature for forming the protection film 33 is 200° C.

Sample 2 is obtained in the following condition. That is, in the semiconductor device 90, amorphized TaN is used as the composition material of the bottom electrode EB1, the bottom electrode EB1 is polished by 5 nm by use of the CMP to have a final thickness of 35 nm, the silicon nitride film is used as the composition material of the protection film 33, and the heat treatment temperature for forming the protection film 33 is 275° C.

Sample 3 is obtained in the following condition. That is, in the semiconductor device 90, Ta is used as the composition material of the bottom electrode EB1, the bottom electrode EB1 is polished by 20 nm by use of the CMP to have a final thickness of 50 nm, the silicon nitride film is used as the composition material of the protection film 33, and the heat treatment temperature for forming the protection film 33 is 275° C.

Sample 4 is obtained in the following condition. That is, in the semiconductor device 90, Ta is used as the composition material of the bottom electrode EB1, the bottom electrode EB1 is polished by 20 nm by use of the CMP to have a final thickness of 50 nm, the silicon nitride film is used as the composition material of the protection film 33, and the heat treatment temperature for forming the protection film 33 is 200° C.

Sample 5 is obtained in the following condition. That is, in the semiconductor device 90, Ta is used as the composition material of the bottom electrode EB1, the stress in the bottom electrode EB1 is made a low stress, the bottom electrode EB1 is polished by 20 nm by use of the CMP to have a final thickness of 50 nm, the silicon nitride film is used as the composition material of the protection film 33, and the heat treatment temperature for forming the protection film 33 is 275° C.

Note that the above low stress means a stress which is approximately one order smaller than stresses in the bottom electrodes EB1 of Samples 1 to 4 and 7. Here, the stresses in the bottom electrodes EB1 of Samples 1 to 4 and 7 are several thousand MPa, and the stresses in the bottom electrodes EB1 of Samples 5 and 6 are several hundred MPa.

Sample 6 is obtained in the following condition. That is, in the semiconductor device 90, Ta is used as the composition material of the bottom electrode EB1, the stress in the bottom electrode EB1 is made the low stress, the bottom electrode EB1 has a thickness of 30 nm without being polished, the silicon nitride film is used as the composition material of the protection film 33, and the heat treatment temperature for forming the protection film 33 is 275° C.

Sample 7 is obtained in the following condition. That is, in the semiconductor device 90, amorphized TaN is used as the composition material of the bottom electrode EB1, the bottom electrode EB1 has a thickness of 35 nm without being polished, the silicon nitride film is used as the composition material of the protection film 33, and the heat treatment temperature for forming the protection film 33 is 275° C.

The number of peeling positions in the protection film 33 is inspected by an optical inspection apparatus for one memory cell MC in each of Samples 1 to 7, and a result thereof indicates one position for Sample 1, zero positions for Samples 2, 3, and 7, ten positions for Sample 4, and ten or more positions for Samples 5 and 6.

This result shows that the peeling of the protection film 33 is rarely detected for all Samples 1, 2, and 7 which use the nitrided Ta for the bottom electrode EB1. This is probably because a coupling is generated between nitrogen of TaN used for the bottom electrode EB1 and nitrogen of SiN used for the protection film 33 and improves the adhesion between the bottom electrode EB1 and the protection film 33.

Further, it is found that the peeling of the protection film 33 is rarely detected in all Samples 1, 2, and 7 which use amorphized Ta for the bottom electrodes EB1. This is probably because a dangling bond (uncoupled hand) is generated on the surface of the bottom electrode EB1 by the amorphousizing of Ta used for the bottom electrode EB1, and the protection film 33 is coupled with the dangling bond of the bottom electrode EB1 when the protection film 33 is formed over the bottom electrode EB1, to improve the adhesion between the bottom electrode EB1 and the protection film 33.

From this reason, it is presumed that this experimental result particularly does not depend on a property inherent to Ta and apply also for a metal other than Ta. Accordingly, it turns out that the adhesion between the bottom electrode EB1 and the protection film 33 is improved also by use of the amorphized metal nitride as the composition material of the bottom. electrode EB1. Further, since this experimental result also does not depend on a property inherent to Si, it turns out that the adhesion between the bottom electrode EB1 and the protection film 33 is improved also by use of an insulating film containing nitrogen for the protection film 33.

According to the above described semiconductor device and manufacturing method thereof, since the bottom electrode EB1 is formed by the amorphized metal nitride (e.g., TaN or WN) and the protection film 33 is formed by the insulating film containing nitrogen (e.g., silicon nitride film), the adhesion is improved between the bottom electrode EB1 and the protection film 33. Thereby, it is possible to prevent the protection film 33 from peeling off from the bottom electrode EB1 and also it is possible to prevent the foreign material ($H_2$, $H_2O$, etc.) from intruding through the interface between the bottom electrode EB1 and the protection film 33, resulting in suppressing the deterioration in the characteristics of the MTJ element MD1.

In addition, since the above amorphized metal nitride is amorphized tantalum nitride (TaN), it is possible to improve the adhesion between the bottom electrode EB1 and the protection film 33 by using a material easy to obtain.

Further, the above experimental data shows that the adhesion can be improved between the bottom electrode EB1 and the protection film 33 also when the bottom electrode EB1 is formed by tantalum nitride (TaN) and the protection film 33 is formed by the insulating film containing nitrogen (e.g., silicon nitride film). Thereby, it turns out that the protection film 33 is prevented from peeling off from the bottom electrode EB1 and also the foreign material ($H_2$, $H_2O$, etc.) is prevented from intruding through the interface between the bottom electrode EB1 and the protection film 33, and thereby the deterioration of the characteristics of the MTJ element MD1 can be suppressed. Accordingly, this embodiment includes the case that tantalum nitride (TaN) is used for the bottom electrode EB1.

Embodiment 2

Figure 23:
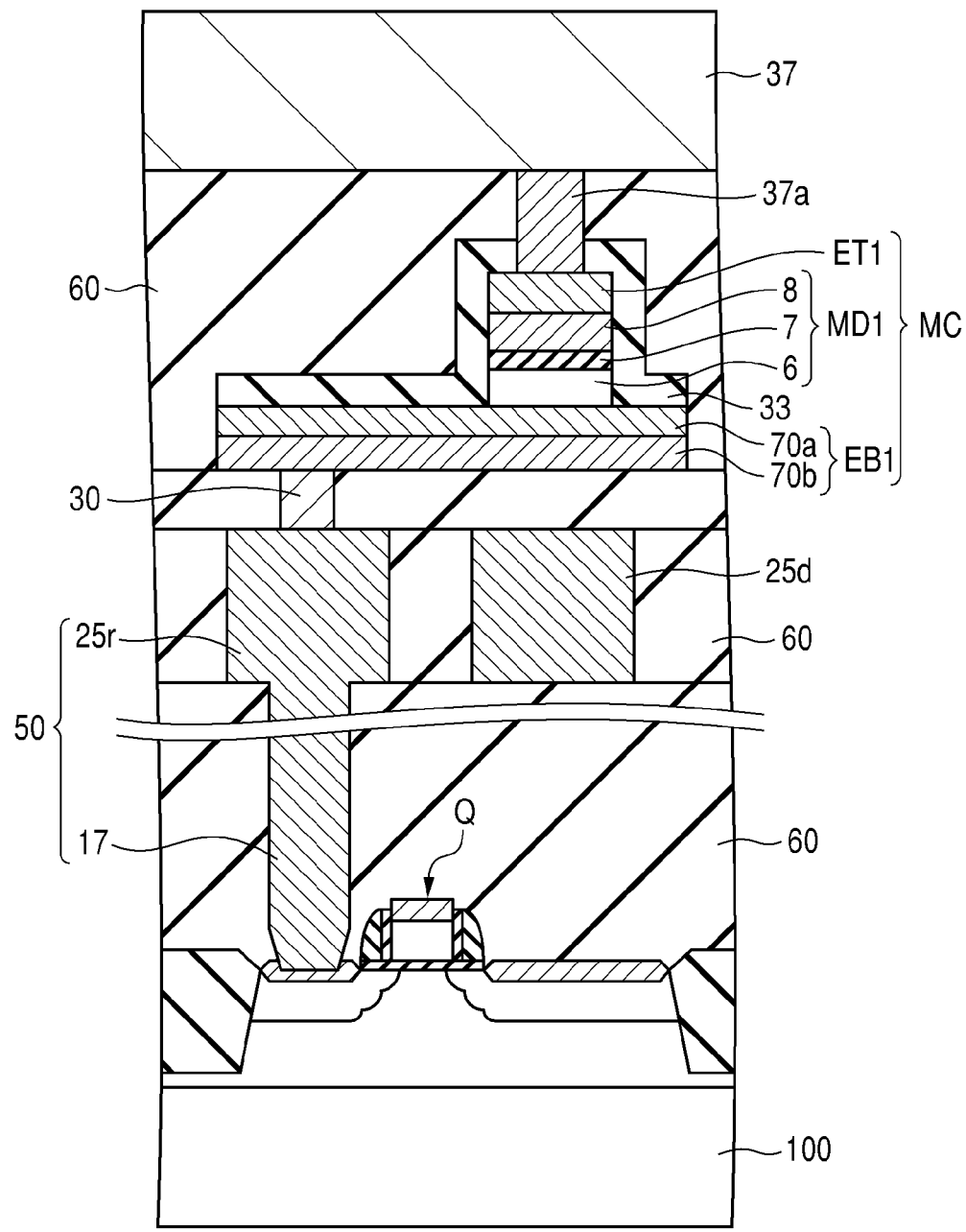
FIG. 23 is a cross-sectional view showing the II-II cross-section of FIG. 1 in the case of Embodiment 2.

In a semiconductor device 90B according to this embodiment, as shown in FIG. 23, the bottom electrode EB1 of Embodiment 1 is configured with a plurality (two in FIG. 23) of conductive layers 70a and 70b, and the top conductive layer 70a is formed by the amorhousized metal nitride (e.g., TaN or WN) and the other conductive layer 70b is formed by a metal which has a higher conductivity than the above amorphized metal nitride (i.e., low resistance metal) (e.g., Ta, W, Ti, and Cu). In the following, the different point from Embodiment 1 will be mainly described.

In Embodiment 2, the bottom electrode EB1 is preferably formed to have a total thickness of 50 to 100 nm as in Embodiment 1 and the top layer conductive layer 70a preferably has a thickness of 10 nm or larger. If the thickness is smaller than 10 nm, there is a possibility that the top conductive layer 70a is eroded by etching during the formation of the bottom magnetic film 6 to expose the lower conductive layer 70b.

In FIG. 23, the bottom electrode EB1 is configured with the two layers of the conductive layers 70a and 70b, and the upper (top) conductive layer 70a is formed by the above amorphized metal nitride and the lower conductive layer 70b is formed by the above metal which has a good conductivity.

Then, the MTJ element MD1 and the top electrode ET1 are laminated sequentially on a part of the upper conductive layer 70a on one end side. Further, over the upper conductive layer 70a, the protection film 33 is formed so as to cover the MTJ element MD1 and the top electrode ET1. In this state, the protection film 33 is formed by the nitride film and also the upper conductive layer 70a is formed by the amorphized metal nitride, and thereby the protection film 33 is formed to adhere strongly to the upper conductive layer 70a.

Next, a manufacturing method of this semiconductor device 90B will be described according to FIG. 15 and FIG. 24 to FIG. 26. In the following, only a different point from the manufacturing method in Embodiment 1 will be described.

Figure 24:
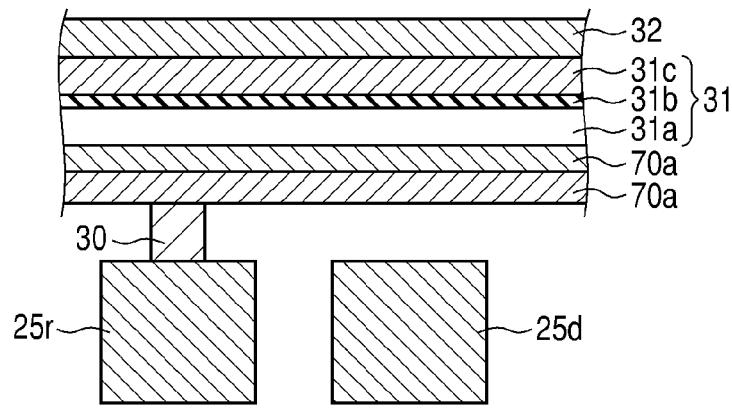
FIG. 24 is a cross-sectional view showing a manufacturing method in Embodiment 2.

Up to the process in FIG. 15, the manufacturing is carried out as same as in Embodiment 1. Then, as shown in FIG. 24, the lower conductive layer 70b and the upper conductive layer 70a are laminated sequentially over the entire surface of the interlayer insulating film 26 so as to cover the barrier metal layer 28 and the via filling metal layer 29, and further thereon are sequentially laminated the bottom magnetic layer 31a, the tunnel insulating film 31b, the top magnetic film 31c, and the top electrode layer 32. In the following, the bottom magnetic layer 31a, the tunnel insulating film 31b, and the top magnetic film 31c are called the MTJ film 31.

In the above process, any one of Ta, W, Ti, and Cu, for example, is used as a composition material and a sputtering method, for example, is used for forming the lower conductive layer 70b. Further, either TaN or WN, for example, is used as the composition material and the reactive sputtering method is used as in Embodiment 1 for forming the upper conductive layer 70b.

Note that, when the lower conductive layer 70b and the upper conductive layer 70a are formed, it is preferable to carry out film forming of the lower conductive layer 70b and the upper conductive layer 70a consecutively without taking out the semiconductor device 90B under production from the chamber by using a sputtering apparatus which can selectively switch a plurality of targets (e.g., target for the lower conductive layer 70b and target for the upper conductive layer 70a) in one chamber, for example. Alternatively, it is preferable to form the lower conductive layer 70b and the upper conductive layer 70a consecutively by carrying the semiconductor device 90B under production between the chambers without exposure to the air, using a sputtering apparatus which is provided with a plurality of chambers including a chamber for depositing the lower conductive layer 70b and a chamber for film forming of the upper conductive layer 70a. Such a film forming method can prevent the lower conductive layer 70b from being exposed to the air.

Figure 25:
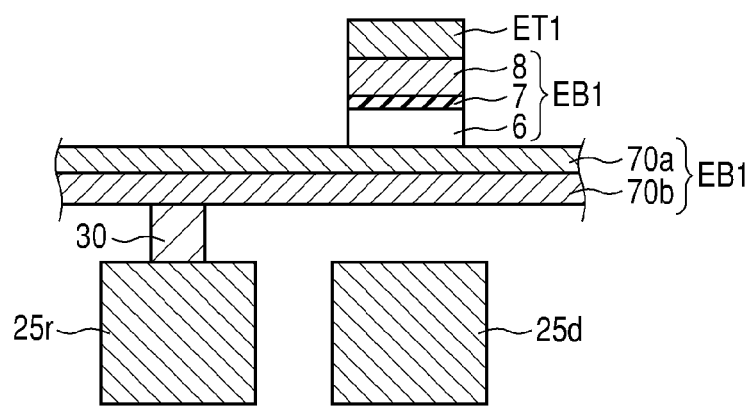
FIG. 25 is a cross-sectional view showing a manufacturing method in Embodiment 2.

Subsequently, as shown in FIG. 25, the MTJ film 31 and the top electrode layer 32 are patterned by use of a patterned resist which is not shown in the drawing, and the MTJ element MD1 and the top electrode ET1 are obtained. These MTJ element MD1 and top electrode ET 1 become the MTJ element part.

Figure 26:
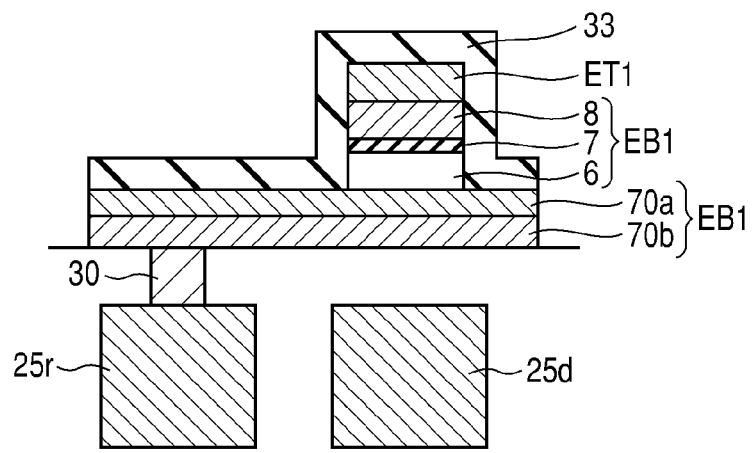
FIG. 26 is a cross-sectional view showing a manufacturing method in Embodiment 2.

Subsequently, as shown in FIG. 26, a nitride film (here, silicon nitride film) is formed over the upper conductive layer 70a as the protection film 33 so as to cover the MTJ element part (MTJ element MD1 and the top electrode ET1), as in Embodiment 1. Then, by use of a patterned resist which is not shown in the drawing, the upper conductive layer 70a, lower conductive layer 70b, and the protection film 33 are patterned, and the bottom electrode EB1 and the protection film 33 are obtained.

Then, as in Embodiment 1, the semiconductor device 90B is completed after the upper contact 37a and the bit line 37 are formed, as shown in FIG. 23.

According to the above described semiconductor device 90B and manufacturing method thereof, since the bottom electrode EB1 is composed of the plurality of conductive layers (e.g., 70a and 70b), and the top conductive layer 70a among the plurality of conductive layers (conductive layer on which the conduction film is formed) is formed by the amorphized metal nitride (e.g., TaN or WN), the adhesion can be improved between the bottom electrode EB1 and the protection film 33. Further, since the other conductive layer 7 among the plurality of conductive layers is formed by the metal which has a higher conductivity than the amorphized metal nitride (i.e., low resistance metal) (e.g., Ta, W, Ti, or Cu), a good conductivity can be secured for the bottom electrode EB1.

Note that this embodiment includes the case that tantalum nitride (TaN) is used for the bottom electrode EB1.

Industrial Applicability

The present invention can be applied to all the magnetic devices having the MTJ structure (particularly MRAM).

What is claimed is:

1. A semiconductor device, comprising:
a bottom electrode formed over a semiconductor substrate;
a Magnetic Tunnel Junction (MTJ) element formed over the bottom electrode by laminating a bottom magnetic film, an insulating film, a top magnetic film, and a top electrode in this order; and
a protection film formed over the bottom electrode so as to cover the MTJ element, the protection film partly making direct contact with the bottom electrode,
wherein the bottom electrode includes metal nitride, and
wherein the protection film includes nitrogen.

2. The semiconductor device according to claim 1, wherein the metal nitride is amorphized metal nitride.

3. The semiconductor device according to claim 2, wherein the amorphized metal nitride is amorphized tantalum nitride (TaN).

4. The semiconductor device according to claim 2, wherein the amorphized metal nitride is amorphized tungsten nitride (WN).

5. The semiconductor device according to claim 1, wherein the metal nitride is tungsten nitride (WN).

6. The semiconductor device according to claim 1, wherein the protection film includes silicon nitride.

* * * * *